(12) United States Patent
Beckwith et al.

(10) Patent No.: US 8,497,731 B1
(45) Date of Patent: Jul. 30, 2013

(54) LOW PASS FILTER CIRCUIT

(75) Inventors: Joel C. Beckwith, Tokyo (JP); Dejan Mijuskovic, Tournefeuille (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/465,046

(22) Filed: May 7, 2012

(51) Int. Cl.
*H03B 1/00* (2006.01)
(52) U.S. Cl.
USPC ............. 327/558; 327/551; 327/96; 327/95
(58) Field of Classification Search
USPC ............. 327/558, 551, 554, 557, 91, 93, 94, 327/95, 96
See application file for complete search history.

(56) References Cited

U.S. PATENT DOCUMENTS

| | | | |
|---|---|---|---|
| 4,739,189 A * | 4/1988 | Kellogg | 327/555 |
| 5,736,895 A * | 4/1998 | Yu et al. | 327/554 |
| 6,445,331 B1 * | 9/2002 | Stegers | 341/172 |
| 6,573,785 B1 * | 6/2003 | Callicotte et al. | 330/9 |
| 7,088,147 B2 * | 8/2006 | Prasad et al. | 327/91 |
| 7,583,088 B2 | 9/2009 | Mijuskovic | |
| 2006/0164131 A1 * | 7/2006 | Ruha et al. | 327/94 |

OTHER PUBLICATIONS

H. Pichler et al., "S&H Circuits for Fast AD Converters," IEEE 0-8186-6430-4, 1994, pp. 603-609.

* cited by examiner

*Primary Examiner* — Lincoln Donovan
*Assistant Examiner* — Jung H. Kim
(74) *Attorney, Agent, or Firm* — Charles Bergere (57) ABSTRACT

A low pass filter circuit includes an amplifier having a single-ended output. A first line and a second line are arranged to receive a differential signal. A first switch selectively connects the first line to a first input of the amplifier in a first cycle of operation having a first observation window. A second switch selectively connects the second line to a second input of the amplifier in a second cycle of operation having a second observation window that is at least partially coincident with the first observation window. A signal measuring stage that is supplied with a modulated input signal generates the differential signal. The signal measuring state has an input switch to reverse a polarity of the differential signal applied to the first and second lines of the low pass filter circuit.

11 Claims, 3 Drawing Sheets

LOW PASS FILTER CIRCUIT

BACKGROUND OF THE INVENTION

The present invention relates to electronic circuits and more particularly to a low pass filter circuit.

It is well known that electrical circuits, such as sensing circuits, generate noise, an obviously undesirable but seemingly inevitable situation. Significant efforts have been undertaken either to reduce or to mitigate the undesirable effects that noise can cause in an electrical circuit. One way is to with an amplifying and filtering circuit that has a single-ended input and a single-ended output. This circuit uses an amplifier that receives a single-ended input signal, implements a sample and hold operation alternately on each of the amplifier inputs achieved by alternately switching switches on each of the amplifier inputs. When a first switch on one of the amplifier inputs is closed, the amplifying and filtering circuit samples a first signal having a noise component. The first switch is opened and a second switch on a second one of the amplifier inputs is closed, thereby allowing the amplifying and filtering circuit to sample a second signal having a desired output component and a correlated noise component. The second switch may then be opened. The first signal is subtracted from the second signal to allow recovery of the desired output component minus correlated noise.

The above technique, while providing acceptable low pass and noise filtering performance is, however, not without its limitations. Accordingly, it would be advantageous to provide new filtering techniques that improve upon the afore-disclosed technique and circuit.

BRIEF DESCRIPTION OF THE DRAWINGS

The present invention is illustrated by way of example and is not limited by the accompanying figures, in which like references indicate similar or identical elements. Elements in the figures are illustrated for simplicity and clarity and have not necessarily been drawn to scale.

DETAILED DESCRIPTION OF THE INVENTION

In an embodiment of the invention, there is provided a low pass filter circuit comprising: an amplifier having a single-ended output; a first line and a second line, the first line and the second line being arranged to receive a differential signal; a first switch for selectively connecting the first line to a first input of the amplifier in a first cycle of operation having a first observation window; and a second switch for selectively connecting the second line to a second input of the amplifier in a second cycle of operation having a second observation window; wherein the low pass filter circuit is configured for the first observation window and the second observation window to be at least partially coincident.

In another embodiment of the invention, there is provided a method of performing a low pass filter operation on a differential signal using a low pass filter circuit comprising an amplifier having a single-ended output, the method comprising: providing the differential signal to a first line of the low pass filter circuit and a second line of the low pass filter circuit; selectively connecting the first line of the low pass filter circuit to a first input of the amplifier using a first switch, the first switch operating in a first cycle of operation having a first observation window; selectively connecting the second line of the low pass filter circuit to a second input of the amplifier using a second switch, the second switch operating in a second cycle of operation having a second observation window; and switching the first switch and the second switch so that the first observation window and the second observation window are at least partially coincident.

In a further embodiment of the invention, there is provided a method of performing a low pass filter operation on a differential signal using a low pass filter circuit comprising an amplifier having a single-ended output, the differential signal being an output signal from a signal measuring stage, the method comprising: providing the low pass filter circuit with an input switch; supplying the signal measuring stage with a modulated input signal; supplying the differential signal to a first line of the low pass filter circuit and a second line of the low pass filter circuit; and switching the input switch to reverse a polarity of the differential signal.

Embodiments of the invention may provide significant technical benefits. For instance, differential circuit architectures are prevalent in this technology domain, and provision of a low pass filter circuit arranged for receipt of a truly differential signal (a signal transmitted on conductors, capable of having some potential on each conductor) allows for embodiments of the invention to be readily implementable with a great many existing differential circuit architectures, and, for example, obviates the requirement for conversion of an output signal of the existing differential circuit architecture discussed above to a single-ended signal, prior to use with the, or another, conventional low pass filter circuit (or even with other types of filters and/or amplifier stages). Embodiments of the invention allow for the differential low pass filter circuit to be used with existing differential circuit architectures by implementing a sample and hold arrangement in which observation windows on the inputs of a differential amplifier are at least partially coincident.

Further, a differential signal has twice the rail-to-rail voltage swing when compared with a single-ended signal, thus providing another reason that the differential input architecture implemented in embodiments of the invention are an improvement in view of the conventional circuit discussed above. Having twice the rail-to-rail voltage swing increases signal-to-noise ratio by 6 dB, providing twice the available maximum potential precision for the device. For signals that are subsequently digitized, this is one additional bit (ENOB) of precision.

Yet further, embodiments of the invention provide a low pass filter circuit with a high input common mode rejection ratio, as use of a differential input signal allows for the common mode of the signal to be relatively low (the common mode component of the input signal may be rejected or attenuated, perhaps heavily attenuated), thereby obviating the requirement for high-specification circuit components, lower-specification circuit components (e.g. components of a lesser maximum voltage rating) being acceptable.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to distinguish between the elements such terms describe. Thus, these terms are not necessarily intended to indicate temporal or other prioritization of such elements.

The circuit elements used to implement the present invention are known to those skilled in the art, so full details will not be explained in any greater extent than that considered necessary for the understanding and appreciation of the underlying concepts of the present invention and in order not to obfuscate or distract from the teachings of the present invention. Further, those skilled in the art will recognize that the circuit components are merely illustrative and that alternative embodiments may include multiple instances of a particular operation, and the order of operations may be altered in various other embodiments.

Figure 1:
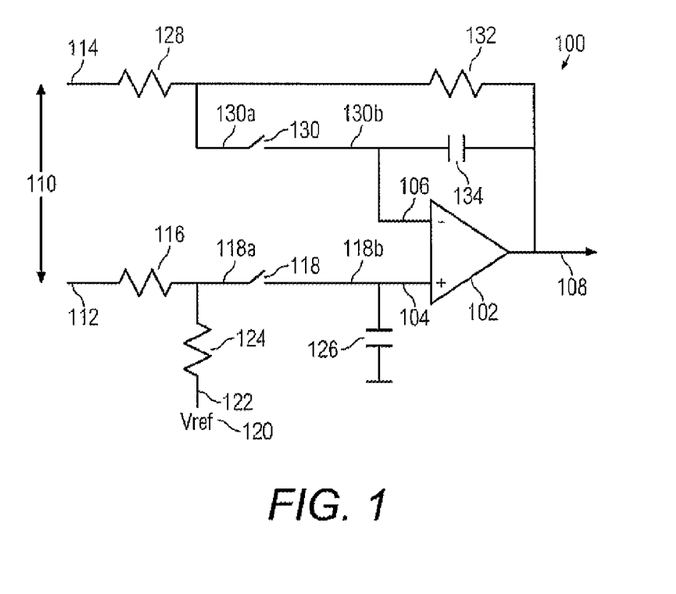
FIG. 1 is an electrical circuit diagram illustrating a low pass filter circuit in accordance with an embodiment of the invention.

Referring now to FIG. 1, a low pass filter circuit 100 in accordance with a first embodiment of the invention is illustrated. The low pass filter circuit 100 comprises an amplifier 102 having a first input 104 and a second input 106. In the embodiment of FIG. 1, the first input 104 is on a non-inverting summing node of the amplifier 102 and the second input 106 is on an inverting summing node of the amplifier 102. The amplifier 102 is a single-ended output amplifier, having an output 108. A differential signal 110 is provided to the first and second amplifier inputs 104, 106 on first and second lines 112, 114, respectively. The first line 112 is connected to the amplifier first input 104 through a first resistor 116 and a first switch 118. A reference voltage supply 120 is also connected to the amplifier first input 104 with a first voltage supply line 122 by way of a second resistor 124. As shown in FIG. 1, the first and second resistor 116, 124 are connected to an input terminal 118a of the switch 118.

An output terminal 118b of the first switch 118 is connected to the amplifier first input 104. A first capacitor 126 is connected between the output terminal 118b of the first switch 118 and ground. In this embodiment, the first capacitor 126, reference voltage 120, and the voltage on the output 108 are all referenced to ground, but ground could be any arbitrary voltage, if desired, provided that all three of the above-mentioned components are referenced to the same voltage.

The second line 114 is connected to the amplifier second input 106 by way of a third resistor 128 and a second switch 130. A fourth resistor 132 is connected in a feedback circuit branch between the single-ended output 108 of amplifier 102 to an input terminal 130a of the second switch 130. A second capacitor 134 is also connected between the single-ended output 108 of amplifier 102 in feedback to the amplifier second input 106, at a node so that it is also connected on an output terminal 130b of the second switch 130, so that the second potential of the differential signal 110 on the second line 114 is connected by way of the second switch 130 to the amplifier second input 106 in parallel with the feedback branch through the second capacitor 134.

Operation of the low pass circuit 100 will now be discussed with reference to FIG. 2 in which a timing diagram 200 illustrating an operation cycle 200 including showing a current cycle 202, a previous cycle 204 and a subsequent cycle 206 is shown. The operation cycle 200 has a period Ts 202.

The operation cycle repeats such that a current period 202 is preceded by a number of previous periods or cycles of operation, the immediately preceding one being the previous operation cycle 204 and succeeded by subsequent operation cycles, the immediately subsequent cycle being subsequent operation cycle 206. In these repeated cycles, the voltage traces in the current cycle 202 are repeated.

The differential input signal 110 illustrates the potentials of, and the potential difference between, the signals on the first and second lines 112, 114 of FIG. 1. The potential on the first line 112 is illustrated by signal trace 208, and the potential on the second line 114 is illustrated by signal trace 210. The first switch 118 operates in a first cycle 212 and the second switch 130 operates in a second cycle 214. In the embodiment of FIG. 1, the first and second cycles 212, 214 are identical (i.e., coincident), so that the first and second switches 118, 130 open and close at the same time, or substantially simultaneously. The timing diagram also shows first and second observation windows 226, 228 of the first and second switches 118, 130, respectively.

It should be noted that it is not essential that that the first and second cycles 212, 214 be fully coincident and in embodiments of the invention, the first and second cycles 212, 214 may be offset in time, so that the observation windows 226, 228 overlap so that there is a period of operation in which both switches are closed. Thus, the first and second observation windows 226, 228 of the first and second switches 118, 130 respectively are at least partially coincident in such embodiments.

Closure of either of the first and second switches 118, 130 allows the signal on the respective one of the first and second input lines 112, 114 to be passed to the respective one of the amplifier inputs 104, 106. As such, closure of either of the first and second switches 118, 130 defines an "on-time", Ton 216 for the switches. As noted above, the duty cycles of the switches 118, 130 are identical in this embodiment of the invention, so the on-time Ton 216 of each switch is also identical. The on-time 216 of the switches 118, 130 is defined by a time instant 218 at which the first and second switches 118, 130 close, and a time instant 220 at which the first and second switches 118, 130 open. Opening of the switches 118, 130 at time instant 220 commences an off period, Toff 222, for the switches that ends at time instant 224, which is the commencement of the subsequent operation cycle 206, and the next on-time Ton of the switches (not illustrated).

In alternative embodiments, the on period 216 may begin at time instances other than at time instance 218, at the beginning of the sequence. The circuit functions if the off time 222 happens first followed by the on time where the end of Ton (instance 220) was the same time as 224. Of course, the duration of Ton, and Toff could remain the same, but the order could change as needed. It is also possible for Ton to occur in the middle of two Toff periods.

The on-time Ton 216 defines the observation windows 226, 228 of the first and second switches 118, 130 in which the potentials on the respective first and second lines 112, 114 are sampled at the first and second inputs 104, 106 of amplifier 102. Thus, the potentials on the first and second lines 112, 114 are "observed", during the on-time Ton 216. This is represented by the traces 212, 214 indicating the cycles of the first and second switches 118, 130. The on period defines the observation windows 226, 228 respectively of the first and second switches 118, 130. Because in the embodiment of FIG. 1, the cycles of operation of the first and second switches 118, 130 are identical, the first and second observation windows are also identical, being coincident with one another.

Figure 2:
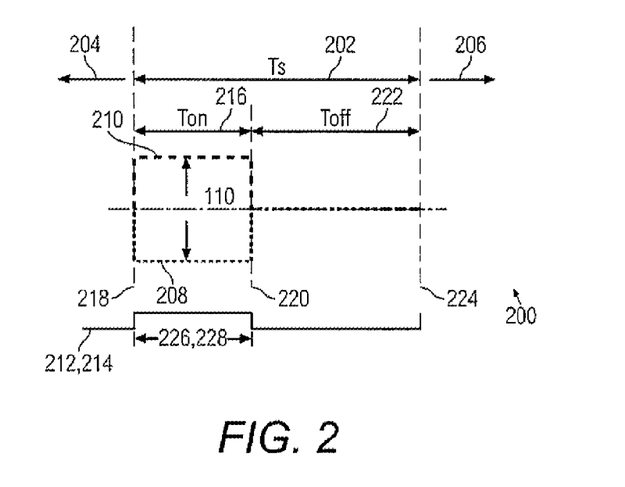
FIG. 2 is a timing diagram illustrating a cycle of operation of the electrical circuit of the embodiment of FIG. 1.

It will be appreciated that FIGS. 1 and 2 illustrate a method of performing a low pass filter operation on a differential signal 110 using the low pass filter circuit 100 The method comprises supplying the differential signal 110 to the first and second lines 112, 114 of the low pass filter circuit 100. The first line 112 is selectively connected to a first input 104 of the amplifier 102 using a first switch 118, where the first switch operates in a first cycle 212, having a first observation window 226. The second line 114 is selectively connected to a second input 106 of the amplifier 102 using a second switch 130, where the second switch operates in a second cycle 214, having a second observation window 228. The first and second switches 118, 130 are switched so that the first and second observation windows 226, 228 are at least partially coincident.

During the observation windows 226, 228 the differential signal 110 is amplified and filtered using the components of the low pass filter circuit 100, and an output signal is output on the single-ended output 108 of amplifier 102. The precise nature of the signal output on output 108 is dependent upon the parameters of the circuit components, resistors 116, 124, 128, 132 and capacitors 126, 134, the duration of the on and off periods 216, 222, and the duration of the period Ts of a cycle of operation 202. It may be desirable that the overall gain of the low pass circuit 100 is unity, in which case the resistance values of the first and second resistors 116 and 124 are chosen to be identical with one another. The same principle applies in the upper half of the circuit 100, on the inverting input, which in the embodiment of FIG. 1 is second amplified input 106, in which case, the values of the third and fourth resistors 128, 132 are chosen to be identical with one another. Also, the values of the third and fourth resistors 128, 132 may be identical to the values of first and second resistors 116, 124.

With all switches closed (continuous operation), the resistance values 116, 128 being identical with one another and the resistance values 122, 132 being identical with one another, the output voltage is defined by the equation:

$$V_{out} = \frac{R_2}{R_1} V_{110} + V_{ref}$$

where $V_{110}$ is the potential difference of the differential signal 110 and $V_{ref}$ is the voltage of the reference voltage supply 120. $R_2$ is the value of resistor 124 and/or resistance 132, and $R_1$ is the value of resistor 116 and/or 128. If all the resistance values are identical with one another (so that the overall gain of the low pass filter circuit 100 is unity), then:

$$V_{out} = V_{110} + V_{ref}$$

where Vref is the reference voltage supply 120, and assuming signals $V_{110}$ that are within the circuit bandwidth. The equation does not hold for $V_{110}$ signals that exceed the bandwidth of the circuit and/or the amplifier, both of which will have some finite bandwidth. Since the differential input voltage is added to the reference voltage 120, the voltage range on the amplifier output 108 is reduced. As mentioned, the differential signal has twice the rail-to-rail swing as a single-ended signal. Preferably, the differential input signal is less than one half of the voltage range on the output 108 to avoid clipping of the output signal, when a unity-gain amplifier is implemented. In such arrangements, the method of low pass filtering comprises providing the differential signal 110 as a signal of a magnitude which is less than one half of a signal voltage range of the single-ended output 108 of the amplifier 102, when the gain is unity or higher (the higher the gain, the lesser the input range). If necessary, the circuit can also be arranged to attenuate. If, with a 1.5 v supply for example, the gain equals to 0.5, then the signal range increases, though the signal is attenuated, rather than amplified. It is also possible to reduce below 0.5 V if high attenuation of the signal is desired, but there would be no benefit of increased signal swing beyond the maximum of +/−1.5 V.

In other embodiments, it may be desirable to have gain trim in the circuit. If the circuit is used to trim and/or calibrate gain, then one less amplifier stage previous to this circuit which would otherwise be required to provide this calibration may not be required. If the gain is not unity, and is for example, 2, then the available input signal is reduced by 2. Assuming the voltage Vref is centered at one half of the available power supply voltage (for supply voltage of Vsup=1.5V, Vref would be 0.75V), then the min/max signal input signal is described by the general equation, Assuming: vref=Vsup/2:

$$\text{Vin,min/max} = +/-\text{Vsup}/(2*G), \text{where } G = R2/R1$$

So for the unity gain case, G=1 and the input signal swing is +/−Vsup/2. This is +/−0.75V.

If the gain is increased to G=R2/R1=2, then our input signal swing reduces to +/−Vsup/4. This is +/−0.375V.

Considering the operation of the circuit 100 when the switches 118, 130 are periodically switched, when switch 118 closes, the voltage on line 112 is applied (sampled) on capacitor 126 via resistor 116. Similarly, when switch 130 closes, the voltage online 114 is applied (sampled) to capacitance 134 via resistor 128. This periodic operation performs a complex filtering operation. The combination of components 128, 134 also act as a RC filter with the same time constant as, in this embodiment, all of the magnitudes of the resistors 116, 122, 128, 132 are identical, and the magnitudes of the capacitors 126, 134 are also identical. Periodically switching this circuit in a pulsed manner acts to limit the current that is added to the capacitors 126, 134 than would otherwise be added should the switches 118, 130 remain closed all the time. This reduction in the current through, for example, resistors 116 or 128 makes the resistance, particularly resistor 124, appear to be a larger magnitude, by a factor of Ts/Ton. The RC filter corner frequency is also decreased by the inverse of this factor, Ton/Ts.

The cut-off frequency $F_c$ of the low pass filter circuit is defined by the equation:

$$F_c = \frac{1}{2\pi R_{124} C} \cdot \frac{T_{on}}{T_s}$$

Where $R_{124}$ is the value of the resistor 124, C is the value of capacitor 126, $T_{on}/T_s$ is the ratio of the switch on-time 216 (typically either 4 μs for one observation window in a cycle of operation or a cumulative 8 μs for two observation windows in a cycle of operation, as will be discussed below with reference to FIG. 4, but other time periods may also be used) to the period 202 (typically, 72 μs).

The observation windows 226, 228 for sampling on capacitors 126 and 134 may be equal in duration. Preferably, the duration of Ton 216 is less than the time constant of the circuit to behave as a filter and for the above approximation for the circuit cutoff frequency to remain valid. If the duration of either of observation windows 226, 228 exceeds the time constant, larger cutoff frequencies may be achieved, but there may also be an adverse impact on the internal noise filtering.

In the embodiment of FIG. 1, a single capacitor 126, 134 is shown connected to each input 104, 106. It will, however, be appreciated that the amount of capacitance on either or both of the inputs 104, 106 may be varied by switching in and out other capacitances. For example, other capacitances may be connected between switch 118 and first input 104, from node 118b to ground in parallel with capacitor 126, through their own switches, and operation of the switches be effected to vary the time constant of the low pass filter circuit 100.

Figure 3:
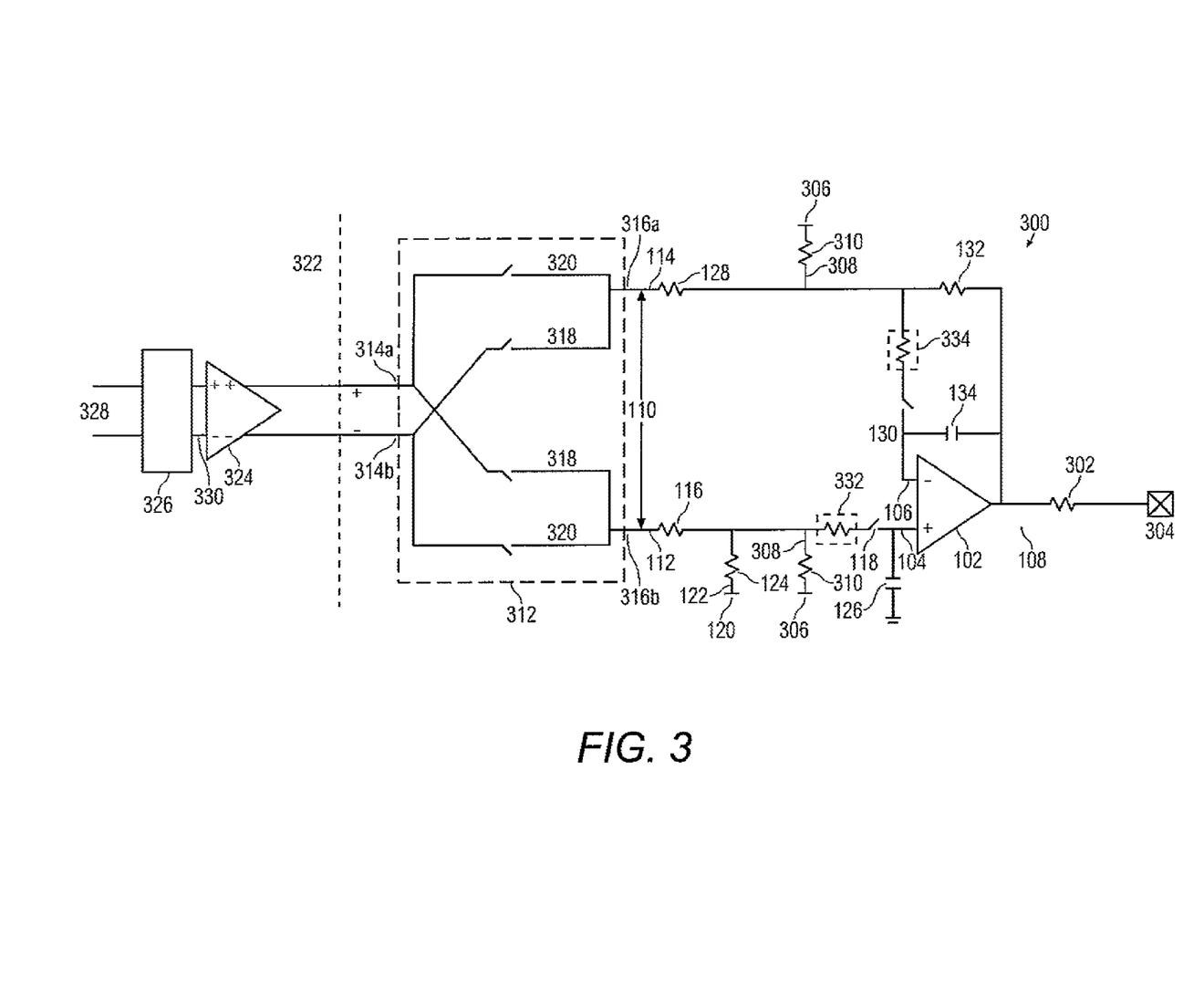
FIG. 3 is an electrical circuit diagram illustrating a low pass filter circuit in accordance with another embodiment of the invention.

Turning now to FIG. 3, a low pass filter circuit 300 in accordance with a second embodiment of the invention is illustrated. Many of the components of the circuit 300 of FIG. 3 operate in a manner identical with corresponding components in the circuit 100 of FIG. 1. Such components are identified with the same reference numerals as the corresponding components in FIG. 1, and a detailed discussion of these components is not repeated. However, in summary, the circuit 300 is provided with an amplifier 102 for receiving a differential input signal 110 on the first and second lines 112, 114. Circuit 300 also provides a single-ended output 108 of the amplifier 102. However, in the circuit 300, an output resistance 302 may optionally be provided for connection at output terminal 304 to another circuit (not illustrated), in which the output resistance 302 may act as a resistance in a RC filter of the other circuit. Use of a subsequent RC filter, of which resistor 302 constitutes the resistance in combination with an external capacitor, is beneficial in reducing the "glitches" (or voltage spikes) that will occur at the output. The switching of the switches in this circuit produces high frequency signals which can and, unfortunately will, be observed at the output. An external RC filter low pass filters and heavily attenuates these often very high frequency components. The external RC filter may also provide further low pass filtering and stronger attenuation of out of band signals, augmenting the low pass filter operation already produced and as described above, which is often desirable, in addition to allowing for the designer to select the external capacitor value, to control the cutoff frequency of this second subsequent filter, as desired. It may be possible to add minimal capacitance to maximize output signal bandwidth, the highest the circuit can achieve, or to use a very large capacitor to low pass filter signals to some low, or very low frequency (even less than 1 Hz if desired).

A second reference voltage supply 306 is connected onto one of the lines, in this instance, first line 112 and first input 104 of the amplifier 102, in parallel with reference voltage supply 120. The reference voltage supply 306 is connected to second voltage supply line 308, which also comprises a resistor 310. Additionally or alternatively, the second reference voltage 306 also may be connected to the second input 106 of the amplifier 102, through the second switch 130. Inclusion of the second reference voltage supply 306 may provide an advantageous voltage narrowing effect, discussed in further detail below. As such, one can see that the low pass filter 300 is arranged for one of the first and second switches 118, 130 to connect selectively a second reference voltage supply 306 to a respective one of the first and second inputs 104, 106 of the amplifier 102. The second resistor 310 is connected via a second supply line 308 of the second reference voltage supply 306.

The circuit 300 further comprises an input switch 312, having an input 314 and an output 316, output 316 having two lines connected to the first and second lines 112, 114 of circuit 300. In the embodiment of FIG. 3, the input switch 312 comprises a chopper having switch pairs 318 and 320. First switch pair 318 connects the input terminals 314a, 314b of input switch 312 to output terminals 316b, 316a respectively of the input switch. Second switch pair 320 connects the input terminals in the reverse arrangement. That is, second switch pair 320 connects the input terminals 314a, 314b of input switch 312 to output terminals 316a, 316b respectively. Operation of input switch 312, and the reason for this arrangement will be discussed in more detail below. In the embodiment of FIG. 3, the arrangement of input switch 312 is such that switches 318 may be closed when switches 320 are open, and vice-versa. Taking, first, the situation where switches 320 are closed, and switches 318 are open, the differential signal on input 314, and input terminals 314a, 314b of switch 312 is passed directly to output 316, to output terminals 316a, 316b respectively and onto lines 114, 112 of circuit 300. If the potential at input 314a is positive (at some potential above ground potential) and the potential at input 314b is negative (at some potential below the input common mode potential), then positive and negative potential signals respectively will be passed to lines 114, 112.

The input common mode potential may be a voltage above ground voltage. This common mode voltage can be equal to reference voltage 120, but does not need to be. In the case that the input common mode voltage is not equal to reference voltage 120 this provides a level shifting or translation.

Since the input common mode voltage might be different depending on the circuit providing the input into circuit 300, it is convenient that circuit 300 is flexible with regards to what input common mode voltages it can reasonably accommodate. Resistance 310 further aids in this accommodation by providing additional control/flexibility, as will be described below.

The voltage on output 108 when the input voltage 110 is 0V is independent of the input common mode voltage. Thus, circuit 300 observers a high common mode rejection ratio, as noted above. This is also desirable since the circuit presenting the signal to 312 might not have a necessarily stable common mode voltage. It might change, say, based on non-idealities in the amplifier, switches, and other components, including common mode signals and noise.

Secondly, in the situation where switches 318 are closed, and switches 320 are open, a differential signal of reverse polarity, in comparison to the first scenario described above, where switches 320 and 318 are, respectively, closed and open, is passed to lines 114, 112. That is, the potential on line 114 is now that received on input terminal 314b of input switch 312, and the potential on line 112 is that which is received on input terminal 314a of input switch 312. So, the potential on line 114 is a negative potential relative to the input common mode, and the potential on line 112 is a positive potential. Thus, circuit 300 further comprises an input switch 312 configured to reverse a polarity of the differential signal 110.

The input 314 of the input switch 312 is a signal which is a differential signal from a signal measuring stage 322, the circuit 300 being provided to perform a low pass filtering operation on the signal output by signal measuring stage 322. As is well known, signal measuring circuits, such as signal measuring stage 322, tend to produce an undesirable component in its signal, such as noise. This noise is caused by, amongst other things, the components of the signal processing stage, such as the differential amplifier 324. As will be described below, it is possible to minimize this corrupting noise contribution to some extent by virtue of the fact that noise is always random, whereas the way in which the signal is manipulated is intentionally not random. In the manner described below, it is possible to discern noise from the signal and minimize the noise via filtering operations.

A signal processing stage 322 is supplied with a modulated input signal, the signal having been modulated by modulator 326. Modulator 326 has an input 328 and an output 330 supplying the modulated input signal to the signal measuring stage 322. Modulator 326 operates periodically to reverse a polarity of the signal (a further reversing of polarity) received on its input 328.

The low pass filter circuit 300 of FIG. 3 may also be optionally provided with resistors 332 and 334, as will be described below.

Operation of the circuit of the embodiment of FIG. 3 is discussed with reference to the timing diagram 200 of FIG. 4. The timing diagram of FIG. 4 is similar, but not identical, to that of FIG. 2 discussed above. As with FIG. 2, the timing diagram of FIG. 4 illustrates a current cycle of operation 202 of circuit 300, the current cycle of operation 202 being preceded by a previous cycle of operation 204 and succeeded by a subsequent cycle of operation 206 in which the voltage traces in the current cycle of operation 202 are repeated.

The differential input signal 110 is again illustrated, it being derived from the potential difference of the signals on lines 112, 114 of FIG. 1. The potential on line 112 is illustrated by signal trace 208, and the potential on line 114 is illustrated by signal trace 210. Again, first switch 118 operates in a first cycle of operation 212, and second switch 130 operates in a second cycle of operation 214. In the embodiment of FIG. 3, cycles of operation 212, 214 are identical (i.e. coincident), so that switches 118, 130 open and close at the same time, or at least substantially simultaneously. Note, however, as with FIG. 1 this is not essential and in embodiments of the invention, the cycles of operation 212, 214 merely overlap so that there is a period of operation in which both switches are closed. Thus, the observation windows 226, 228 of the first and second switches 118, 130 are at least partially coincident in such embodiments.

The input switch 312 has an input switch cycle of operation 402. Two switch cycles 402a, 402b are illustrated, for the operation of the switch pair 320 and the switch pair 318 respectively. Closure of either of the switch pairs 318, 320 defines a conducting window for the input switch 312. Two conducting windows 404a, 404b are illustrated, for the switch pairs 320 and 318 respectively. These are periods in which the input switch 312 passes the differential signal 110 to the first line 112 and the second line 114. Low pass filter circuit 300 is configured for the conducting window 404a or 404b to be at least partially coincident with the first observation window 226a or 226b and the second observation window 228a or 228b. In alternative embodiments, more than two observation windows may be used.

Again, closure of either of the first and second switches 118, 130 defines an "on-time", Ton 216 for the switches. As noted above, the duty cycles of the switches 118, 130 are identical in this embodiment of the invention, so the on-time Ton 216 of each switch is also identical. The on-time 216 of the switches is defined by the time instant 218 at which the first and second switches 118, 130 close, and the time instant 220 at which the first and second switches 118, 130 open. One difference in the timing diagram 400 of FIG. 4 when compared with that of FIG. 2, is that in each period Ts, each of switches 118, 130 are closed and then opened twice, defining two conducting periods 216a, 216b, and two non-conducting periods 222a, 222b. Opening of the switches 118, 130 at time instant 220 commences a first off period, Toff 222a, which ends at time instant 218a, at the commencement of the second on period 216b in the cycle of operation 202, which, in turn, terminates at time instant 220a when the switches 118, 130 reopen. The cycle of operation 202 completes with the ending of the second off period 222b, went switches 118, 130 are closed again to commence the subsequent cycle of operation 206. As such, input switch 312 operates in an input switch cycle of operation 402, input switch 312 being configured to alternate the polarity of the differential signal 110 in cycles of the input switch cycle of operation.

Again, the on-time 216 of the switches defines an observation window of each of the switches in which the potential on the respective first and second lines 112, 114 are sampled on the first and second capacitances 126, 134, through the respective resistances 116, 128. In the timing sequence diagram of FIG. 4, this is represented by the traces 212, 214 indicating the cycles of operation of the first and second switches 118, 130. The on period defines the first observation windows 226a, 228a of switches 118, 130 respectively and the second observation windows 226b, 228b respectively of switches 118, 130. Because in the embodiment of FIG. 1, the cycles of operation of the first and second switches 118, 130 are identical, the first and second observation windows of switches 118, 130 are identical, these being coincident with one another.

The periods when the switches 318, 320 are closed define conducting windows of the switches. In the embodiment of FIG. 3 and FIG. 4, switches 320 are closed at time instant 218 thereby commencing a (first) conducting window 404a of input switch 312; the conducting window 404a is a period in which the input switch passes the signal received on the input 314, in this first on period 404a through switches 320 of input switch 312. In this embodiment, switches 320 are closed at the same time as the closure of switches 118, 130. Note that it is not essential that switches 320 be closed at exactly the same time as the switches 118, 130, but the on period 216a should at least overlap with the conducting window 404a; that is, they should be at least partially coincident. As switches 320 and switches 118, 130 are closed, this allows the signal on lines 112, 114, output on output 316 of input switch 312 to be sampled on the first and second inputs 104, 106 of amplifier 102. Switches 320 are then opened at the time instant 220, terminating the (first) conducting window 404a of the input switch 312. The differential signal 110 is not then output on output 316 of input switch 312, and this is illustrated by the first off period 222a. Thus the input switch 312 can be considered to be a chopper switch, chopping a discrete-time or continuous input signal on input 314, converting it to a discrete time signal on output 316. The chopper operation may be used on modulated signals. In such a case, a continuous signal may be input into 328 for modulation by modulator 326 (which discretizes the signal, encoding it into pulses). If a continuous time input is applied to 314, the chopper uses one pair of switches (320, or 318 if a signal inversion is desired) and close a single switch pair all of the time, for a continuous input signal to continuous output signal. In such a case, the chopper is not performing a chopping operation but acting as a switch. Alternatively, the chopper may close a single switch pair part of the time, more specifically, for one or more of the conducting windows when (or at least partially coincident to when) 118 and 130 are being closed for a continuous time input signal to discrete time output signal. In all operations of this circuit, switches 118, 130 ultimately sample and make the signal discrete time. So the amplifier only really "sees" what is presented at its input during the time these switches close. This means that a continuous signal and discrete time signal could look identical from its point of view. These techniques allow for the presentation of the signals in several ways to achieve the same result.

Note that the input switch 312 can be omitted from the circuit when the signal output by signal processing stage 322 is a discrete time signal.

Figure 4:
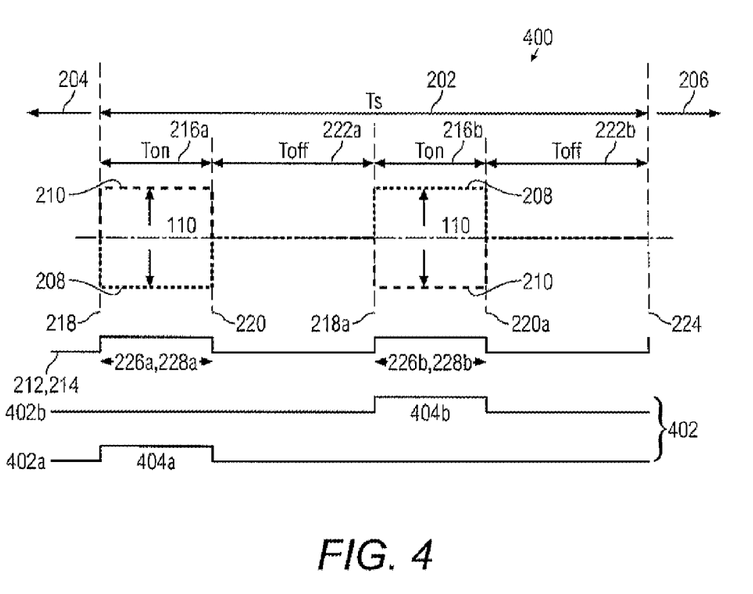
FIG. 4 is a timing diagram illustrating a cycle of operation of the electrical circuit of the embodiment of FIG. 3.

It will be appreciated that FIGS. 3 and 4 illustrate a method of performing a low pass filter operation on a differential signal 110 using a low pass filter circuit 300 comprising an amplifier 102 having a single-ended output 108. The method comprises providing the differential signal 110 to a first line 112 of the low pass filter circuit 100 and a second line 114 of the low pass filter circuit 100. The first line 112 of the low pass filter circuit 100 is selectively connected to a first input 104 of the amplifier 102 using a first switch 118, where the first switch operates in a first cycle of operation 212, having a first observation window 226a or 226b. The second line 114 of the low pass filter circuit 100 is selectively connected to a second input 106 of the amplifier 102 using a second switch 130, where the second switch operates in a second cycle of operation 214, having a second observation window 228a or 228b. The first switch 118 and the second switch 130 are switched so that the first observation window 226 and the second observation window 228 are at least partially coincident. However, and as noted above, in the embodiment of FIG. 1, the first and second observation windows are coincident with one another.

Signal processing stage 322 produces the modulated differential input signal. This may be achieved using a switched capacitor circuit composed of a differential amplifier with two input capacitors, one connected to each amplifier summing node in addition to two feedback capacitors, one connected from each amplifier output to the summing node input of the opposite polarity (thus providing negative feedback). The ratio of input capacitor value divided by the feedback capacitor value determines the voltage gain of the circuit from input to output across phases of switched operation.

Embodiments of the invention may have particular application for accelerometer devices, in which case the input capacitors can be produced directly from a mechanical capacitive element sensitive to acceleration—a spring mass system. The input capacitor value will therefore change in magnitude proportionally (generally) to acceleration. The feedback capacitor is fixed in value and is chosen accordingly to the particular application.

The voltage placed on the input capacitors (at the capacitor terminal not at the amplifier summing node) is switched from one voltage value to a second voltage value, one input capacitor in switched in one polarity, and the second in the opposing (or inverse) polarity. This voltage step, Vstep, is called an excitation voltage and a charge, Q=Cinput * Vstep is "pushed" onto the amplifier summing nodes. The amplifier outputs react accordingly, converting this charge into a voltage at its outputs. Since each input experienced an input voltage step of opposing polarity, the outputs diverge and a differential output signal is created (centered about some desired common mode voltage.)

If the voltage to the input capacitors is subsequently switched in the opposite polarity relative to the initial step applied with twice the magnitude as the initial step (e.g. initially the inputs experience +Vstep, and then experience a −2*Vstep) then the differential output voltage will invert and the two outputs will swap voltages. The resultant signal from this two step action is two pulses, a first differential output signal with one polarity, followed by a voltage of same magnitude but the opposite polarity. This is a modulated differential signal containing measurement data, in this case acceleration. This signal can subsequently be distinguished from random noise by virtue of its unique nature and applied to any manner of circuits including the low pass filter described in the invention.

For products where the measuring device or element is non-capacitive, the input capacitors to the amplifier are made instead as fixed capacitor values, and a differential voltage is applied to the input capacitors in a modulated way. One method of modulating such a voltage input is by use of a Wheatstone bridge circuit and applying two voltages across the bridge (e.g., V1 and V2), followed by swapping the voltages applied across the bridge in the opposite polarity (e.g., V2 and V1).

Other mechanisms are possible including combining two single ended signals into a differential signal.

Timing of the modulation of the input signal 328 may be synchronized with the timing of the operation of switches 318 and 320, and switches 118 and 130. Thus, as switches 318, 320 "chop" the signal output by the signal processing stage 322, and reverse its polarity as discussed above with reference to FIG. 4, a second reversal of polarity may be effected with modulator 326. This alternating operation, with the double inversion of the signal, the first inversion by modulator 326, and the second inversion by input switch 312, allows for some useful manipulation of the two sampled signals, in the conducting windows 404a, 404b. The first signal in first conducting window 404a, in on period 216a is sampled onto the capacitances 126, 134 during the first observation window. The second signal in second conducting window 404b is inverted by the chopper switches 318, and is sampled onto capacitances 126, 134 during the second conducting window 404b, in on period 216b. The two signals may then be aggregated, in a manner different from the aggregation of the noise component. Applying the two signals to the circuit during observation window 226a, 226b, and observation window 228a, 228b provides a useful filtering effect. Referring again to FIG. 3, the input signal 328 to the signal processing stage 322 is passed through a modulator 326. The noise output by the signal measuring stage 322 generated by the amplifier 324 and other components of signal measuring stage 322 has not been modulated.

If the differential signal 110 input to the circuit 300 in the first conducting window 404a is, say, +1 volt and, say, −1 volt in the second conducting window 404b, the magnitude on output 108 rises toward +1 volt in the first conducting window and fall toward vref−1 volt during the second conducting window, but assuming the duration of these windows is brief (i.e., the duration, Ton, is less than RC, the effect of this 1V noise signal (it is noise signal since it is inverted between phases when observed specifically at point 110) will be desirably attenuated. The voltage across the capacitors will increase by, say, one time constant (Tau) towards the magnitude of the differential input signal 110, but not quite fully reaching that magnitude. In embodiments, the resistance and capacitance values are selected so that by the end of the first conducting window 404a, the output voltage has reached 63.2% of the magnitude of the input voltage. This voltage will then be held upon opening of the switches 118, 130 and/or the switches internal to input switch 312. In the second conducting window 404b, the voltage on output 108 will again vary according to the RC time constant, this time falling from 63.2% of the difference from the previously held (sampled) voltage value (which will be represented on node 108) to the current input voltage value 110 (now −1V), as the input voltage polarity has been reversed by operation of the switches 318, 320, to a negative value. (The value 63.2% assumes that the duration of the observation Tobs is the same as the time constant in at least one embodiment.)

As noted, circuit 300 observes an input differential signal which is applied twice, in opposing polarities. This fact has a beneficial impact on the noise performance which applies to the following noise derivation. The chopper switches at the input of the circuit 300 act to invert the signal polarity between observations (samples). In an approximation, the filter aggregates noise during the observation windows. If the input noise waveform is n(t), then the output noise sample (sampled at Fs) is given by:

$$n_{out}(T_{on}) = \frac{1}{T_{on}} \cdot \int_0^{T_{on}} n(t) \cdot dt$$

which represents a particular value of the moving aggregates at t=Ton. This is first order sinc filter as given by:

$$\int_0^{T_{on}} n(t) \cdot dt =$$

$$\int_{-\infty}^{T_{on}} n(t) \cdot dt - \int_{-\infty}^{0} n(t) \cdot dt \Rightarrow \frac{1}{j\omega} \cdot N(j\omega) - \frac{1}{j\omega} \cdot N(j\omega) \cdot e^{-j\omega T_{on}} =$$

$$\frac{1}{j\omega} \cdot N(j\omega) \cdot (1 - e^{-j\omega T_{on}})$$

which leads to:

$$T_{filter}(j\omega) \equiv \frac{N_{out}(j\omega)}{N(j\omega)} = e^{-j\omega t_{obs}/2} \cdot \frac{\sin(\omega \cdot T_{on}/2)}{\omega \cdot T_{on}/2}$$

This low pass filter has a bandwidth $$f_{BW} = \frac{1}{2 \cdot T_{on}}$$

Then the output noise power Pout is found as:

$$P_{out} = \Phi_{in} \cdot f_{BW} = \frac{\Phi_{in}}{2 \cdot T_{on}}$$

where $\Phi_{in}$ is the input noise power spectral density (PSD).

Since output noise is sampled at Fs=1/Ts, the output noise bandwidth is Fs/2 so that output noise PSD becomes:

$$a\Phi_{out} = \frac{P_{out}}{f_s/2} = \frac{\Phi_{in}}{2 \cdot T_{on}} \cdot \frac{1}{f_s/2} = \frac{\Phi_{in}}{T_{on} \cdot f_s} = \frac{\Phi_{in}}{T_{on} \cdot f_s} = \Phi_{in} \cdot \frac{T_s}{T_{on}}$$

Now the equivalent number of noise folds due to averaging the input during tobs periodically with period Ts is:

$$M_{fold} \equiv \frac{\Phi_{out}}{\Phi_{in}} = \frac{T_s}{T_{on}}$$

The filter performs two observations, stores and aggregates the samples onto the sample capacitors 126, 134. The resultant spectral density of aggregated samples is quantified by the following two equations, where $M_{fold}$ is the number of noise folds, or number of times the input noise is aliased in the output signal:

$$M_{fold} = \frac{T}{2 \cdot T_{on}} \text{ and}$$

$$\Phi_{out\_final} = \Phi_{in} \cdot \frac{T_s}{2 \cdot T_{on}}$$

Exemplary numbers are as follows:

$$f_{BW} = \frac{1}{2 \cdot T_{on}};$$

$$T_{on} = (2 \times 4) \mu s \rightarrow f_{BW} = 125 \text{ kHz}$$

$$M_{fold} = \frac{T_{s\_c2v}}{2 \cdot t_{obs}}; \frac{72 \mu s}{2 \cdot 4 \mu s} \rightarrow M_{fold} = 9$$

As noted above, embodiments of the invention may provide for a low pass filter circuit with a high input common mode rejection ratio. In these embodiments, exemplary values for the potential on each of lines 112, 114 may be chosen to have a common mode of, for example, 0.65 V. This is beneficial because the chopper switches 318, 320 of the input switch 312 may then be implemented more easily with, say, use of one MOSFET for each of them. Higher common modes may require complementary MOSFET pairs for the chopper switches 318, 320 thus requiring additional footprint for the switch, increased component count, increased cost, and capacitive coupling of noise or charge injection due to switching of clock signals.

Further, provision of the second reference voltage 306 and its connected resistance 310 may provide a benefit in terms of voltage narrowing. This input signal to the filter circuit 300 has a specific output voltage range. If this voltage was applied directly to the amplifier inputs 104, 106, the input range, if it is maximized as is desirable to do, would require a more complicated amplifier design (either rail to rail input stage, or native transistors). By the addition of resistance 310, the input voltage signal may be narrowed or divided to alleviate the input range actually applied to the amplifier summing nodes (inputs 104, 106). This allows for the design constraints for the amplifier to be considerably simplified. For instance, if each of resistances 116, 124 and 310 are 500 kohm resistors, a reduction of signal swing by a factor of 3 may be realized on input 104. The voltages applied are reduced in absolute terms, which allows for P-type MOSFETs to be utilized, although the input range could be altered such that N-type MOSFETs could be used if desired.

By now it should be appreciated that there has been provided a novel method of filtering the output signal of a single generation stage, using a low pass filter circuit comprising an amplifier arranged to receive a truly differential input signal, and provide a single-ended output signal. Embodiments of the invention provide for an effective, yet relatively simple, low pass filter with a cut-off frequency of −3 dB. The filter behaves as a single pole low pass filter (when the observation window is less than or equal to the RC time constant) which will have a characteristic −3 dB frequency.

When the duration of the observation window is greater than the RC time constant, the low pass filter is better described as a sinc filter. In all cases, the amplifier transfer function is a sinc function, but when the observation window is less than or equal to the RC time constant, the sinc function approximates quite closely a traditional single pole low pass filter, and so it is described as such because this description is more easily understood.

As noted above, the low pass filter circuit 300 of FIG. 3 may also be optionally provided with resistors 332 and 334. In these alternative embodiments, resistor 322 is connected in the lower half of the circuit, in the branch of the amplifier first input 104, in series with switch 118, on the input side of the switch, the side on which the signal to be filtered and amplified is received (although, alternatively, it may be provided on the amplifier side of the switch, and this may have merit in filtering some of the glitch signals from the switch). In at least one of these alternative embodiments, resistor 332 is connected to amplifier input 104 on the amplifier side of resistance 112, between the second reference voltage supply 306 branch and switch 118. Resistor 334 is connected in the upper half of the circuit, in the branch of the second amplifier input 106, on the input side of switch 130 (although it may also be provided on the amplifier side of the switch). In at least one of these alternative embodiments, resistor 334 is connected to amplifier input 106 on the input side of switch 130, between the second reference voltage supply 306 branch and switch 130.

With $R_T$ (R1∥R3) equal to resistance 112 in parallel with resistor 124, the continuous transfer function with switches 118, 130 closed continuously is derived as:

$$F(s) \equiv \frac{V_{out\_se}}{V_{in\_diff}} = \frac{R_2}{R_1} \cdot \frac{1}{1 + R_4 \cdot \left(1 + \frac{R_2}{R_4} + \frac{R_2}{R_T}\right) \cdot C \cdot s}$$

where $R_2$ is the resistance value of resistor 124 and/or resistance 132, $R_1$ is the resistance value of resistor 116 and/or resistor 128, $R_4$ is the resistance value of resistance 332 and/or resistance 334, C is the capacitance value of capacitor 126 and/or capacitance 134 and s represents complex frequency, s=j*w.

Additionally, the cut-off frequency, $F_c$ is defined by:

$$Fc = \frac{1}{2 \cdot \pi} \cdot \frac{1}{R_4 \cdot C} \cdot \frac{1}{1 + \frac{R_2}{R_4} + \frac{R_2}{R_T}}$$

Where R4 is the resistance value of resistance 332 and/or 334. Addition of one or both of these resistors allows alteration of the low pass filter cutoff frequency. Then, with a total of two observation windows at Fs 1/Ts, where Ts is the duration or fundamental period of the operation of the circuit, as we use it in our figures, the filtered transfer function becomes:

$$F_c = \frac{1}{2 \cdot \pi} \cdot \frac{1}{R_4 \cdot C} \cdot \frac{1}{1 + \frac{R_2}{R_4} + \frac{R_2}{R_T}} \cdot 2 \cdot T_{on} \cdot F_s$$

And the corresponding transfer function is defined by:

$$F_{S/H}(s) \equiv \frac{V_{out\_se}}{V_{in\_diff}} = \frac{R_2}{R_1} \cdot \frac{1}{1 + \frac{s}{2 \cdot \pi \cdot F_c}}$$

A benefit which may be realized from this arrangement is that the cut-off frequency of the filter circuit 300 can be controlled by changing the values of the resistances 332, 334 only. Insertion of these R4 resistors does not affect the DC gain or the DC voltages. If a reduction of the cut-off frequency is realized by increasing the values of resistances 124, 132 then the other resistance values must also be increased in order to preserve again and DC voltages. Further, the differential to single-ended signal translation function is preserved, including the input common mode rejection.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A low pass filter circuit, comprising:
an amplifier having a single-ended output;
a first line and a second line arranged to receive a differential signal;
a first switch for selectively connecting the first line to a first input of the amplifier in a first cycle of operation having a first observation window;
a second switch for selectively connecting the second line to a second input of the amplifier in a second cycle of operation having a second observation window,
wherein the first and second observation windows are at least partially coincident;
a first resistor connected in series between the first line and the first switch;
a first reference voltage supply connected to a first node between the first resistor and the first switch;
a second resistor connected between the first reference voltage supply and the first node;
a first capacitor, wherein a first terminal thereof is connected to a second node between the first switch and the first input of the amplifier;
a third resistor connected in series between the second line and the second switch; and
a second capacitor connected in a feedback path between the amplifier output and the second input of the amplifier, and
wherein the low pass filter circuit is arranged for one of the first switch and the second switch to connect selectively the first reference voltage supply to a respective one of the first and second inputs of the amplifier and for the one of the first switch and the second switch to connect selectively a second reference voltage supply to the respective one of the first and second inputs of the amplifier.

2. The low pass filter circuit of claim 1, further comprising an input switch configured to reverse a polarity of the differential signal.

3. The low pass filter circuit of claim 2, wherein the input switch operates in an input switch operation cycle, the input switch being configured to alternate the polarity of the differential signal in cycles of the input switch operation cycle.

4. The low pass filter circuit of claim 3, wherein the input switch comprises a chopper, the input switch cycle of operation having a conducting window in which the input switch is arranged to pass the differential signal to the first and second line, and wherein the low pass filter circuit is configured for the conducting window to be at least partially coincident with the first and second observation windows.

5. A method of performing a low pass filter operation on a differential signal using a low pass filter circuit comprising an amplifier having a single-ended output, the method comprising:

supplying the differential signal to a first line of the low pass filter circuit and a second line of the low pass filter circuit;

selectively connecting the first line of the low pass filter circuit to a first input of the amplifier using a first switch, the first switch operating in a first cycle of operation having a first observation window;

selectively connecting the second line of the low pass filter circuit to a second input of the amplifier using a second switch, the second switch operating in a second cycle of operation having a second observation window;

switching the first switch and the second switch so that the first observation window and the second observation window are at least partially coincident;

selectively connecting a first reference voltage supply to one of the first input of the amplifier and the second input of the amplifier using a respective one of the first switch and the second switch; and selectively connecting a second reference voltage supply to the one of the first input of the amplifier and the second input of the amplifier using a respective one of the first switch and the second switch.

6. The method of claim 5, further comprising:

supplying the low pass filter circuit with an input switch; and switching the input switch to reverse a polarity of the differential signal.

7. The method of claim 6, further comprising operating the input switch in an input switch cycle of operation to alternate the polarity of the differential signal in cycles of the input switch cycle of operation.

8. The method of claim 7, wherein the differential signal is an output signal from a signal measuring stage, the method further comprising supplying the signal measuring stage with a modulated input signal.

9. The method of claim 7, wherein the input switch comprises a chopper, the method further comprising passing the differential signal to the first line and the second line in a conducting window of the input switch cycle of operation, the conducting window being at least partially coincident with the first observation window and the second observation window.

10. The method of claim 5, further comprising selectively connecting the first reference voltage supply to the one of the first input of the amplifier and the second input of the amplifier with a first resistance connected in a first supply line of the first reference voltage supply.

11. A method of performing a low pass filter operation on a differential signal using a low pass filter circuit comprising an amplifier having a single-ended output, the method comprising:

supplying the differential signal to a first line of the low pass filter circuit and a second line of the low pass filter circuit;

selectively connecting the first line of the low pass filter circuit to a first input of the amplifier using a first switch, the first switch operating in a first cycle of operation having a first observation window;

selectively connecting the second line of the low pass filter circuit to a second input of the amplifier using a second switch, the second switch operating in a second cycle of operation having a second observation window; and switching the first switch and the second switch so that the first observation window and the second observation window are at least partially coincident; and providing the differential signal as a signal of a magnitude which is less than one half of a signal voltage range of the single-ended output of the amplifier, the amplifier having a gain of unity.

\* \* \* \* \*